US007826511B1

(12) United States Patent
Yap et al.

(10) Patent No.: US 7,826,511 B1
(45) Date of Patent: Nov. 2, 2010

(54) OPTICALLY PUMPED LASER WITH AN INTEGRATED OPTICAL PUMP

(75) Inventors: Daniel Yap, Newbury Park, CA (US); David Persechini, Santa Monica, CA (US); Authi Narayanan, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 257 days.

(21) Appl. No.: 11/090,453

(22) Filed: Mar. 25, 2005

(51) Int. Cl.
*H01S 3/091* (2006.01)
(52) U.S. Cl. ............................... 372/75; 372/70; 372/69
(58) Field of Classification Search .................. 372/70, 372/75, 69
See application file for complete search history.

(56) References Cited

U.S. PATENT DOCUMENTS

| 4,321,559 | A | | 3/1982 | Esterowitz et al. | 372/41 |
|---|---|---|---|---|---|
| 5,513,204 | A | * | 4/1996 | Jayaraman | 372/96 |
| 5,754,578 | A | | 5/1998 | Jayaraman | 372/50 |
| 5,796,771 | A | * | 8/1998 | DenBaars et al. | 372/75 |
| 5,799,026 | A | | 8/1998 | Meyer et al. | 372/45 |
| 6,341,137 | B1 | * | 1/2002 | Jayaraman et al. | 372/50.1 |
| 6,404,791 | B1 | | 6/2002 | Yang | 372/45 |
| 6,418,156 | B1 | * | 7/2002 | Peressini | 372/66 |
| 2003/0025171 | A1 | * | 2/2003 | Geske et al. | 257/455 |
| 2003/0026312 | A1 | * | 2/2003 | Clayton et al. | 372/50 |

OTHER PUBLICATIONS

U.S. Appl. No. 11/090,436, filed Mar. 25, 2005, Yap et al.
Choi, H.K., "High-Power Optically Pumped GaInSb/InAs Quantum Well Lasers Wtih GaInAsSb Integrated Absorber Layers Emitting At 4 μm," *CMM4 of the Digest of 2000 Congerence on Lasers and Electro-Optics*, pp. 63-64 (2000).

Felix, C.L., et al., "High-Efficiency Midinfrared 'W' Laser with Optical Pumping Injection Cavity," *Applied Physics Letters*, vol. 75, No. 19, pp. 2876-2878 (1999).
Garbuzov, D.Z., et al., "2.3-2.7-μm Room Temperature CW Operation of InGaAsSb-AlGaAsSb Broad Waveguide SCH-QW Diode Lasers," *IEEE Photonics Technology Letters*, vol. 11, No. 7, pp. 794-796 (1999).
Gmachl, C., et al., "Ultra-Broadband Semiconductor Laser," *Letters to Nature*, vol. 415, pp. 883-887 (2002).
Goyal, A.K., et al., "High-Efficiency Optically-Pumped Mid-IR Lasers With Integrated Absorbers," *IEEE Lasers and Electro-Optics Society 13th Annual Meeting*, pp. 249-250 (2000).
Jayaraman, V., et al., "Uniform Threshold Current, Continuous-Wave, Singlemode 1300nm Vertical Cavity Lasers From 0 to 70° C," *Electronic Letters*, vol. 34, No. 14, pp. 1405-1407 (1998).
Meyer, J.R., et al. "Type-II Quantum-Well Lasers For The Mid-Wavelength Infrared," *Applied Physics Letters*, vol. 67, No. 6, pp. 757-759 (1995).

(Continued)

*Primary Examiner*—Minsun Harvey
*Assistant Examiner*—Kinam Park
(74) *Attorney, Agent, or Firm*—HRL Laboratories, LLC; George R. Rapacki; Daniel R. Allemeier

(57) ABSTRACT

An apparatus and method for building an optically pumped laser integrated with an electrically driven pump laser is disclosed. The apparatus disclosed comprises an optically pumped laser containing an active layer and an optical pump laser containing an optical mode at least partially overlapping and propagating substantially parallel to optically pumped laser's active layer. The method discloses forming an optically pumped gain element containing an active layer, forming a pump laser containing an optical mode at least partially overlapping and propagating substantially parallel to optically pumped gain element's active layer.

20 Claims, 5 Drawing Sheets

OTHER PUBLICATIONS

Olesberg, J.T., et al., "Mid-Infrared InAs/GaInSb Separate Confinement Heterostructure Laser Diode Structures," *Journal of Applied Physics*, vol. 89, No. 6, pp. 3283-3289 (2001).

Ongstad, Andrew P., et al., "High-Temperature Performance in ~4 μm Type-II Quantum Well Lasers With Increased Strain," *Journal of Applied Physics*, vol. 92, No. 10, pp. 5621-5626 (2002).

Vurgaftman, I., et al., "Photonic-Crystal Distrubted-Feedback Lasers," *Applied Physics Letters*, vol. 78, No. 11, pp. 1475-1477 (2001).

Yang, Rui. Q., et al. "Mid-Infrared Type-II Interband Cascade Lasers," *IEEE Journal of Quantum Electronics*, vol. 38, No. 6, pp. 559-568 (2002).

* cited by examiner

US 7,826,511 B1

OPTICALLY PUMPED LASER WITH AN INTEGRATED OPTICAL PUMP

CROSS REFERENCE TO RELATED APPLICATIONS

This application is related to co-pending application U.S. application Ser. No. 11/090,436, filed on the same day as the present application, for "Optically Pumped Stepped Multi-Well Laser" by Daniel Yap, David Chow and Authi Narayanan, the disclosure of which is incorporated herein by reference.

FIELD

This invention relates to an optically pumped laser with an integrated electrically driven optical pump laser.

BACKGROUND AND PRIOR ART

Optically pumped laser systems with high power conversion efficiency will enable them to be used in applications that require compactness or portability. The power conversion efficiency includes the efficiencies of the optical pump laser as well as of the optically pumped laser. The need for improved pump light utilization of optically pumped lasers has been known for many years, with the best power conversion efficiency achieved (for semiconductor lasers emitting at 3-5 micron wavelengths) being only 0.08 per output facet at a temperature of 200K. The present disclosure aims to improve that power conversion efficiency while also operating at room temperature.

A substantial amount of related, but different, prior art exists for optically pumped semiconductor lasers. However, the prior art has not used an integrated optical pump with a longitudinal-cavity optically pumped laser and especially with an optically pumped external-cavity laser. The best prior attempt at improving the efficiency of optically coupling the pump light to an optically pumped laser is described in Applied Physics Letters, v. 75, n. 19, pp. 2876-2878 (1999). This prior work employs a separate (not integrated) optical pump laser with the pump light vertically incident on the optically pumped laser. A vertical optical cavity is formed in this prior art to achieve multiple passes of the pump light. In contrast, for the present invention the pump light co-propagates in the longitudinal direction with the light generated by the optically pumped laser. The present invention also places the gain medium of the optically pumped laser within the longitudinal optical cavity for the pump laser.

A vertical-cavity semiconductor laser with an integrated optical pump has been described by V. Jayaraman in U.S. Pat. Nos. 5,513,204 and 5,754,578 and in Electronics Letters, v. 34, n. 14, pp. 1405-1407, 1998. However, these prior lasers are vertical-cavity devices wherein light from the pump laser is coupled into the optically pumped laser through the high-reflection mirror of the pump laser rather than by having the transverse optical-field distribution of the pump laser at least partially overlap the gain region of the optically pumped laser, as disclosed presently. The pump laser and the optically pumped laser described by V. Jayaraman are arranged end to end. In contrast, the pump laser portion and the optically pumped gain element portion of the laser disclosed herein are arranged side to side, sharing the same end facets of the substrate material and having their transverse fields at least partially overlap.

BRIEF DESCRIPTION OF THE FIGURES AND THE DRAWINGS

DETAILED DESCRIPTION

Unlike the prior art, the present specification discloses a combined laser that contains both an edge-emitting optical gain element (GE) and an optical pump laser (PL). The edge-emitting optical gain element (GE) of this combined laser is optically pumped by the integrated optical pump laser (PL) that may have an edge-emitting configuration. The light emitted by the PL and the light emitted by the GE may have different wavelengths, with the wavelength of the PL emitted light being shorter than the wavelength of the GE emitted light. Both the PL and the GE may be made from semiconductor materials and may share the same end facets. Alternatively, the GE may be made from other materials, for example, ion-doped solid state materials. The end facets may serve as high-reflection mirrors for the PL and as low-reflection or moderate-reflection surfaces for the GE. By properly selecting the compositions and thicknesses of a coating applied to an end facet, that coating may serve the dual functions of an anti-reflection coating or a partial-reflection coating at the wavelength of the GE-emitted light, and of a high-reflection coating at the wavelength of the PL-emitted light.

Unlike prior art, the transverse optical field profile of the PL at least partially overlaps the transverse optical field profile and the pump absorbing portions of the GE. Also, the light generated by and emitted in the PL may propagate in the same directions with the light generated by the GE. Since the PL has high-reflectivity mirrors, most of the optical loss experienced by the PL may mainly be due to absorption of that light in the GE that is integrated with the PL.

Figure 1:
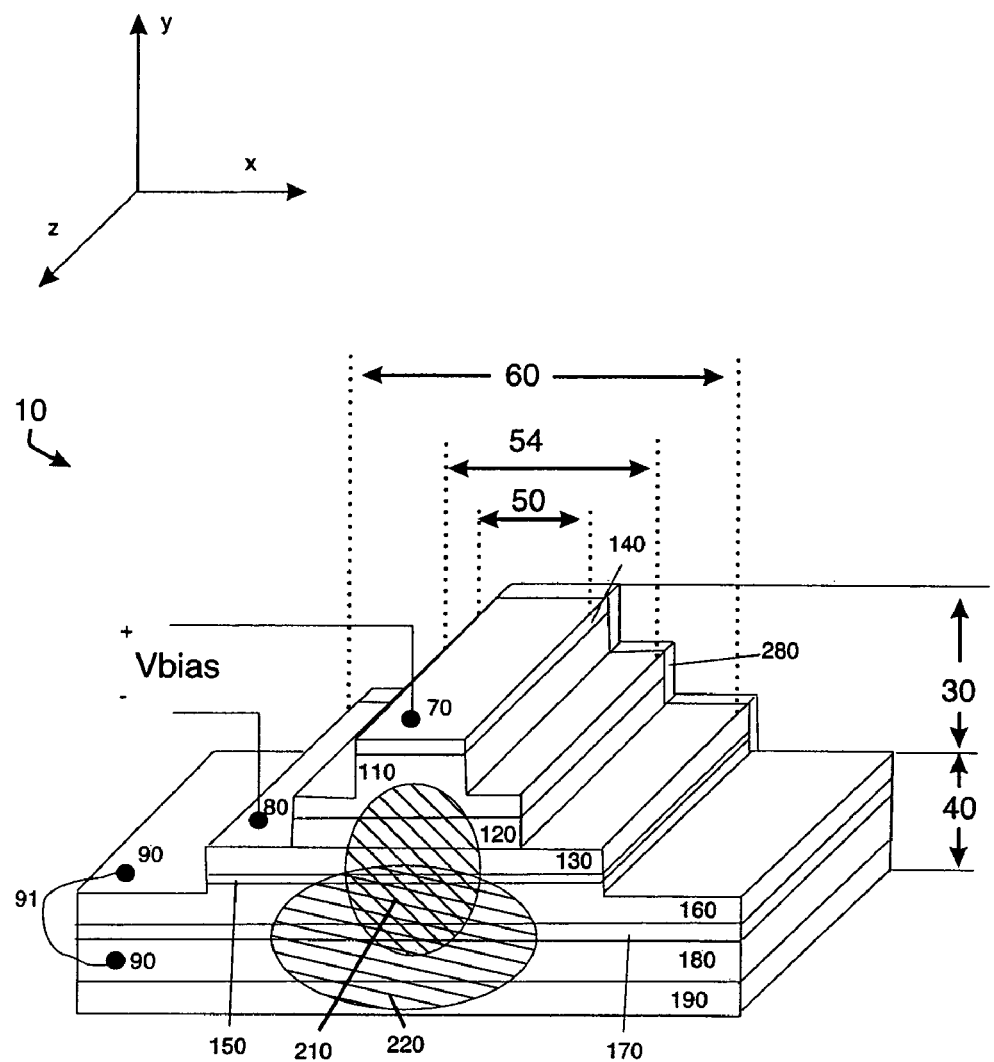
FIG. 1 depicts an exemplary perspective view of the laser with integrated optical pump.
Figure 2:
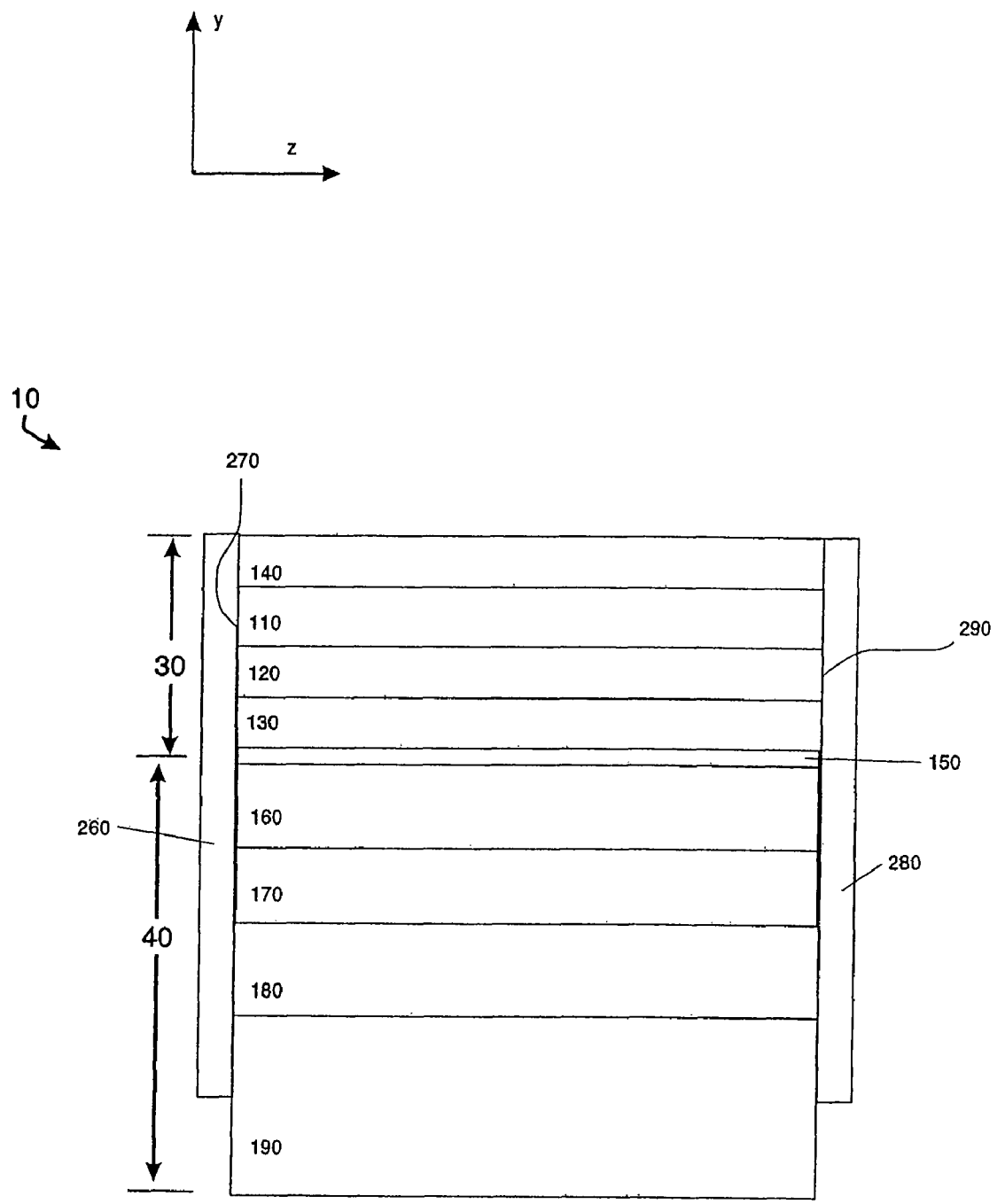
FIG. 2 depicts a side view of the laser in FIG. 1.

FIG. 1 is a cut away 3-D view and FIG. 2 is a side view of an exemplary laser with integrated optical pump (LIOP) 10.

Referring to FIGS. 1 and 2, in one exemplary embodiment, the LIOP 10 may contain two groups of laser materials. The first group of laser materials may consist of a group of epitaxial layers 30 for an optical pump laser (PL). The second group of laser materials may consist of a group of epitaxial layers 40 for the gain element (GE) of an optically pumped laser. The PL layers 30 may be designed to emit light at various wavelengths including but not limited to one-point-fifty-five (1.55) μm, zero-point-ninety-eight (0.98) μm, or one-point-fourty-eight (1.48) μm. The GE layers 40 may be designed to emit light at a wavelength different from the PL light, including but not limited to wavelengths in the range of two-point-five (2.5) μm to seven-point-five (7.5) μm.

The GE layers 40 and PL layers 30 may be physically attached together by methods such as wafer bonding or heteroepitaxial growth (not shown). The GE layers 40 and PL layers 30 may be grown on separate substrates and then wafer-bonded together at a bond interface 150. The substrate upon which the PL layers 30 may be grown may be removed.

Referring to FIGS. 1 and 2, the epitaxial layers 30 may contain an active layer 120, from which the pump light may be emitted, sandwiched between cladding layers 110, 130. The PL layers 30 may also include an optional contact layer 140 disposed on top of the cladding layer 110.

The active layer 120 may be formed from materials such as GaInAsP or GaInAlAs. The active layer 120 may additionally comprise sub-layers (not shown); multiple quantum well (MQW) structures (not shown); or MQW structures with separate-confinement layers or additional waveguiding layers (not shown).

The cladding layers 110 and 130 may, for example, be formed from materials such as InP, InAlAs or GaInAsP. Contact layer 140 may be formed from materials such as GaInAs. The cladding layer 110 and contact layer 140 may be doped p-type while cladding layer 130 may be doped n-type. Alternatively, cladding layer 130 may be doped p-type while cladding layer 110 and contact layer 140 may be doped n-type. Although the contact layer 140 and cladding layer 110 may be similarly doped, contact layer 140 may have a smaller bandgap and a heavier doping than cladding layer 110. Each of the layers 110, 130 and 140 may further comprise additional sub-layers (not shown).

Continuing in reference to FIGS. 1 and 2, the epitaxial layers 40 for the optically pumped GE may contain an active layer 170 sandwiched between an upper cladding layer 160 and a lower cladding layer 180. Layers 160, 170, 180 may be grown on a substrate 190.

The upper cladding 160 may be formed from materials such as InAsSbP, AlSb, AlAsSb or AlGaAsSb. The lower cladding 180 may be formed from materials such as InAsSbP, AlSb, AlAsSb or AlGaAsSb. The substrate 190 may contain materials such as GaSb or InAs. The upper and lower cladding layers 160 and 180 may be doped n-type or p-type, to facilitate the flow of carriers from the active layer 170 through cladding layers 160 and 180 and through an external electrical connection 90.

The active layer 170 may emit light produced by the GE and may also absorb pump light emitted by the PL. The active layer 170 may be a single layer formed from materials such as InAsSb or InGaAsSb. The active layer 170 may also contain one or more quantum wells (not shown) that may absorb PL's pump light and emit GE's light. With plurality of quantum wells, adjacent quantum well layers may be separated by barrier layers (not shown), forming a multi-quantum-well (MQW) structure (not shown).

For a GE formed from antimonide based materials, the quantum wells may contain materials such as InGaSbAs, InAsSb, InAs, or GaInSb. The barrier layers may contain materials such as AlGaAsSb, AlGaSb, InAsP, or InGaAsSb. The quantum wells may have a Type I conduction and valence band alignment or a Type II conduction and valence band alignment.

The active layer 170 may further contain a plurality of sub-layers (not shown) that absorb PL's pump light and sub-layers (not shown) that generate the light produced by the GE. The PL's pump light absorbing sub-layers may contain materials such as InGaAsSb. The GE's light generating sub-layers may contain materials such as InGaSbAs, InAsSb, InAs, or GaInSb and AlGaAsSb, AlGaSb, InAsP, or InGaAsSb.

The active layer 170 may also contain one or more of the substructures of a Stepped Multi-Well laser as disclosed in U.S. patent application Ser. No. 11/090,436, filed on the same day as the application for "Optically Pumped Stepped Multi-Well Laser" by Daniel Yap, David Chow and Authi Narayanan, the disclosure of which is incorporated herein by reference.

Referring to FIG. 1, the PL layers 30 may be electrically driven or electrically modulated. The PL layers 30 of the LIOP 10 may have at least two electrical contacts, a P-contact 70 and an N-contact 80. Although the optically pumped GE layers 40 do not need to be electrically driven, an external electrical connection 91 through connection points 90 may be provided to the GE layers 40 of the LIOP 10. The external electrical connection 91 provides an external path so as to interconnect portions of the GE layers 40 with other portions of the GE layers 40.

Since electrical current does not need to be supplied from the contacts 70 and 80 to the GE layers 40 or from connection points 90 to the PL layers 30, the wafer-bond interface 150 may serve as an optical coupling interface and may comprise electrically insulating materials such as a silicon oxide or another oxide.

Referring to FIG. 1, in one exemplary embodiment, the combined laser structure 10 may contain a dual, nested ridge waveguide structure comprised of ridges 50 and 60. Etching through the contact layer 140 and into the cladding layer 110 may, for example, form the ridge 50 for the optical waveguide of the PL. Etching into the upper cladding layer 160 of the GE may form the ridge 60 for the optical waveguide of the GE, which may be larger than the PL's waveguide ridge 50. Although the PL and GE may be ridge waveguide structures, other types of optical confinement or waveguiding structures that yield well-defined optical emission patterns may be implemented for the PL and for the GE. These and other suitable structures are disclosed in Applied Physics Letters, v. 78, n. 11, pp. 1475-1477 (2001), incorporated herein in its entirety by this reference.

Referring to FIG. 1, in another exemplary embodiment, the combined laser structure 10 may contain a triple, nested ridge waveguide structure comprised of ridges 50, 54 and 60. Etching through the contact layer 140 and into the cladding layer 110 may, for example, form the ridge 50 for the optical waveguide of the PL. Etching through cladding layer 110, active layer 120 and cladding layer 130 may, for example, form the ridge 54. Ridge 54 is optional and is used to enhance the performance of the pump laser. Etching into the upper cladding layer 160 of the GE may form the ridge 60 for the optical waveguide of the GE, which may be larger than the PL's waveguide ridge 50.

Referring to FIG. 1, the active layer 120 may supply pump light for the active layer 170 through PL's optical mode 210. The optical mode 210 may be an optical-waveguided mode of the light generated by the PL that propagates in the Z-direction of the PL's longitudinal optical cavity. The optical mode or modes 210 may be one or more guided modes that have defined transverse EM field distributions. The field distribution of the optical modes 210 of the PL may at least partially overlap the active layer 170 of the GE.

Referring to FIG. 1, the active layer 170 may emit light through GE's optical mode 220. The optical mode or modes 220 are the optical-waveguided modes of the light generated by the GE that propagate in Z-direction of the GE's longitudinal optical cavity. The optical mode or modes 220 of the GE may be one or more guided modes that have defined transverse EM field distributions.

Referring to FIGS. 1 and 2, PL and GE share chip facets 270, 290 located along the end walls of the LIOP 10. Multi-layer coatings 260, 280 may be applied onto the facets 270, 290 wherein the facets 270, 290 in combination with multi-layer coatings 260, 280 may act as high-reflection surfaces that define the ends of the optical cavity for the PL. The high reflection of the end surfaces of the PL cavity may reduce the electrical drive current for the PL and may improve PL's power-conversion efficiency. The facets 270, 290 coated with coatings 260, 280 further may act as nonreflecting surfaces for the GE so as to enable the chip to act as a gain element in an external-cavity laser. In another exemplary embodiment, the coated facets 270, 290 may also act as partially reflecting surfaces for the GE to enable the chip to act as a stand-alone laser.

Figure 3A:
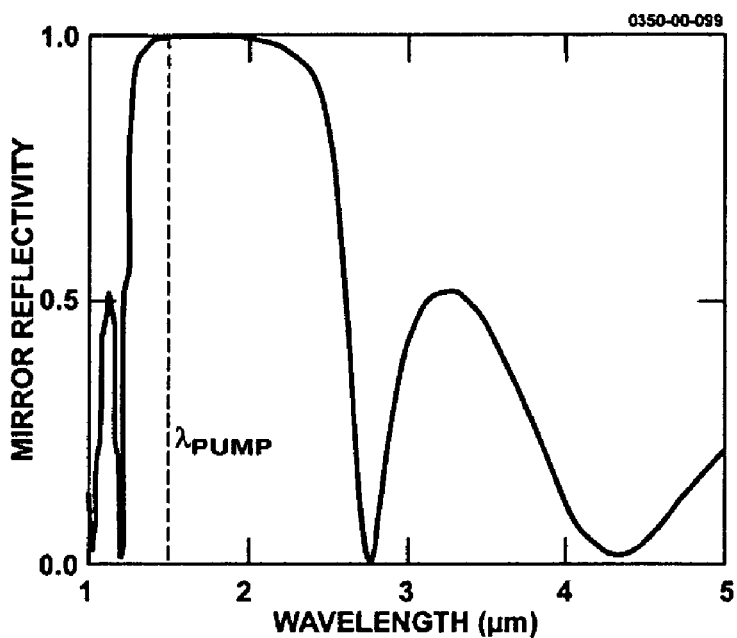
FIGS. 3a and 3b depict the wavelength dependent reflectivity of two separate exemplary facet coatings that may be applied to the laser with integrated optical pump.
Figure 3B:
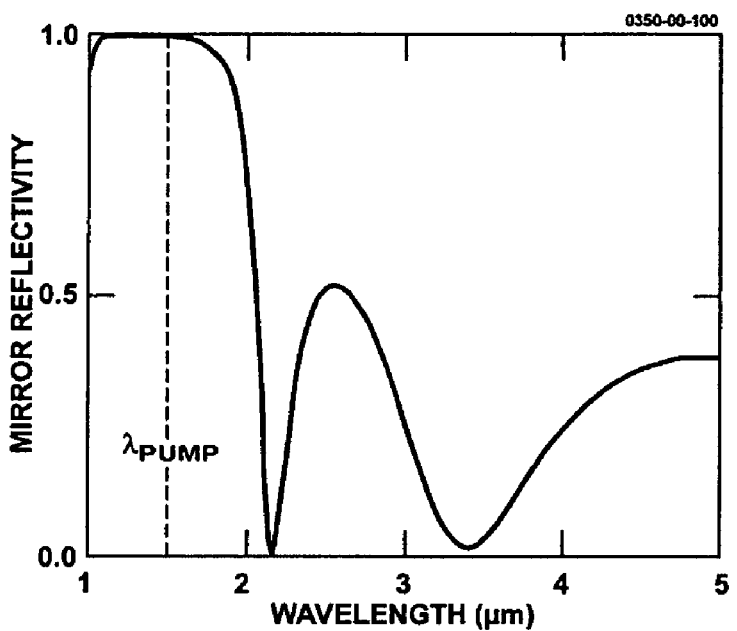

FIGS. 3a and 3b show the optical reflection calculated at different wavelengths for two exemplary coatings that may be applied to facets 270, 290. As shown in FIGS. 3a and 3b, the coatings may provide both a reflectivity of approximately 100%, for example, at one-point-four-eight (1.48) and one-point-five-five (1.55) μm wavelength, and a reflectivity of less than 1%, for example, for wavelengths in the range between two-point-two (2.2) μm and five (5) μm. The specific wavelengths for which low reflectivity may be achieved may be changed by using different values for the thicknesses and complex refractive indices of the materials comprising the coatings 260, 280. The coatings 260, 280 may be formed from materials such as silicon, silicon dioxide, titanium oxide or halfnium oxide.

The integration of PL layers 30 and GE layers 40 into the LIOP 10 provide a high pumping efficiency. Since the PL has high-reflection coated-facet mirrors much of the optical loss in PL's laser cavity may arise from absorption of the pump light by the integrated GE wherein the pump light may be absorbed in the active layer 170, as discussed above. Electrical carriers that are generated in the light emitting layers, such as the quantum wells in active layer 170, may recombine to produce the light emitted by the GE. The electrical carriers may be generated in separate pump-absorbing layers of active layer 170 as a result of the PL's pump light absorption. The electrical carriers tend to go into the light-emitting quantum wells of active layer 170 because of the concentration gradient produced by the radiative carrier recombination in active region 170 as well as the conduction-band and valence-band potential wells located in active region 170.

Referring to FIGS. 1 and 2, upper cladding layer 160 and lower cladding layer 180 may be transparent to the pump light and to the light emitted by the GE. The thickness of the lower cladding layer 180 may be designed to separate the optical mode 210 of the pump laser from the substrate 190 so that the pump light is not drawn into the substrate 190, which may reduce the efficiency of the pump laser. The substrate may, for example, contain GaSb material, which has a high optical refractive index compared to the refractive indices of the materials comprising PL layers 30. The thickness of upper cladding layer 160, in combination with the thickness of the cladding layer 130 above it, may be designed to optimize the coupling of the pump light between the PL and the GE as well as the size and number of the optical mode or modes 210.

The optical mode or modes 210 of the PL may be distributed across both the PL layers 30 and the GE layers 40 and substantially parallel to the facets 270, 290. The optical mode or modes 220 of the GE may also be distributed across both the PL layers 30 and the GE layers 40 and substantially parallel to the facets 270, 290. The size of optical mode or modes 220 may be larger than the size of optical mode or modes 210 due to the wavelength of the light emitted by the GE being longer than the wavelength of the pump light. Also, the two modes 210, 220 may be confined by different ridge structures, as discussed above. Known techniques may be used to design the size and number of optical mode or modes 210 and 220.

Although absorption from interband transitions may be avoided by appropriate selection of materials within PL layers 30, there may be some free-carrier absorption of the GE-emitted light by the doped layers in PL layers 30. Forming cladding layer 110 from p-type materials and cladding layer 130 from n-type materials may reduce the amount of the free-carrier absorption.

Figure 4:
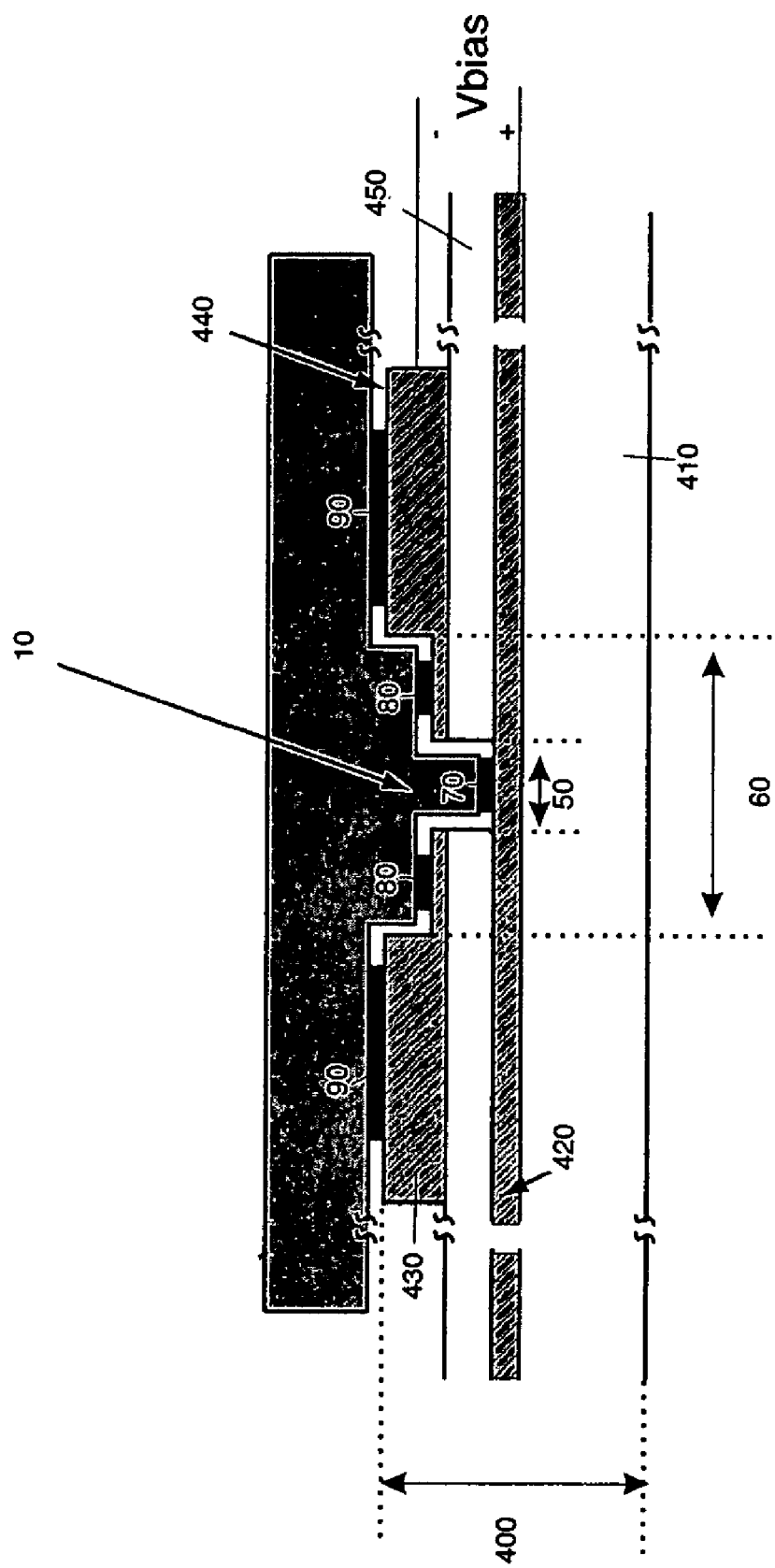
FIG. 4 depicts a cross-section view of the laser in FIG. 1 and an exemplary heat sink.

Referring to FIG. 4, in one exemplary embodiment, the LIOP 10 may be inverted and mounted on a heat sink 400. For clarity reasons, optional ridge 54 is not shown in FIG. 4. The heat sink 400 may contain a conducting metal region 420 in electrical and thermal contact with the ridge 50 of the PL. The heat sink 400 may also contain conducting metal regions 430, 440 in electrical and thermal contact with cladding layer 130's metal contacts 80 of the PL. A non-conductive layer 450 may separate the conducting metal regions 430, 440 from conducting metal region 420. The heat sink 400 may also provide one or more thermal and electrical contacts 90 to the GE through the conducting metal regions 430, 440. The conducting metal regions 430, 440, conducting metal region 420 and a non-conductive layer 450 may be formed on a substrate 410. The conducting metal regions 430, 440 and 420 may, for example, contain materials such as Au and Cu. The electrically non-conductive layer 450 may, for example, contain thermally conductive materials such as aluminum nitride or diamond. The substrate 410 may, for example, contain materials such as Cu or diamond. Electrically and thermally conducting bonds such as gold-to-gold thermo-compression bonds or various known solder bonds may be used to bond the laser 10 to the heatsink 400 at their various points of electrical and thermal contact. An electrically non-conductive but thermally conductive paste may also be used to fill the spaces between the LIOP 10 and the heat sink 400.

External electrical connections may be made to the LIOP 10 through conducting metal regions 430, 440 and conducting metal region 420. The external electrical connections may be used to supply current to the PL. The external electrical connections may also be used to establish a forward bias voltage for the diode obtained from PL layers 30. The external electrical connection may further be used to provide an electrical path between upper cladding layer 160 and lower cladding layer 180 through the electrical contacts 90.

Figure 5:
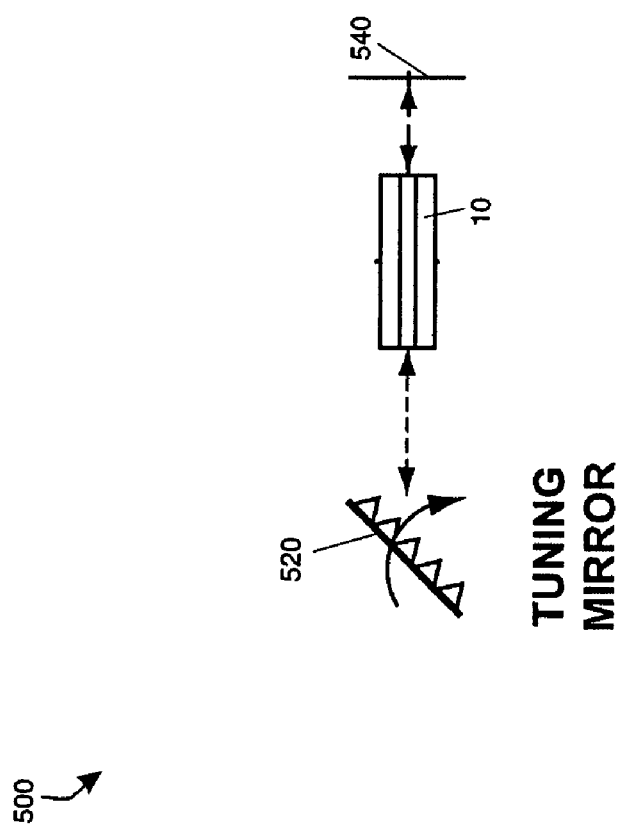
FIG. 5 depicts an exemplary wavelength tunable laser module.

Referring to FIG. 5, in one exemplary embodiment, a tunable external-cavity laser (ECL) 500 may be constructed using the LIOP 10 for which the GE may have non-reflecting coated-facet surfaces. The optical cavity of ECL 500 may comprise an external grating 520, the LIOP 10 and a partially reflecting external mirror 540. The wavelength of the ECL 500 may be selected by the position of the external grating 520 or the positions of other optical elements in the optical path between LIOP 10 and external grating 520. Various known means for constructing wavelength tunable external optical cavities could be used for the ECL 500. In one exemplary embodiment, a Littrow grating may be implemented for the external grating 520. In another exemplary embodiment, a Littman-Metcalf configuration may be implemented for the external grating 520.

In an exemplary embodiment, the substrate 190 may be replaced with a one-dimensional or two-dimensional grating pattern (not shown) to increase output brightness of the LIOP 10.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A laser structure comprising:
   an optically pumped laser containing an active layer, wherein two opposite peripheral edges of said active layer are disposed at facets along two opposite edges of said laser structure, wherein light of the optically pumped laser propagates substantially perpendicular to said facets; and
   an optical pump laser, wherein two opposite edges of said optical pump laser are disposed at said facets,
   wherein pump light of said optical pump laser propagates substantially perpendicular to said facets, and
   wherein an optical mode of said optical pump laser at least partially overlaps said active layer.

2. The laser structure of claim 1 further comprising:
   coating disposed on said facets, wherein said coating reflects said pump light of said optical pump laser.

3. The laser structure of claim 2 wherein said coating at least partially reflects light generated by said optically pumped laser.

4. The laser structure of claim 2 wherein said coating transmits light generated by said optically pumped laser.

5. The laser structure of claim 1 wherein portions of said optical pump laser are wafer-bonded to portions of said optically pumped laser.

6. The laser structure of claim 1 further comprising:
   a heat sink, wherein said heat sink provides electrical contacts to said optical pump laser.

7. The laser structure of claim 1 wherein said optical pump laser further comprises:
   one or more quantum well layer structure, said one or more quantum layer structure emitting pump light.

8. The laser structure of claim 1 wherein said active layer in said optically pumped laser further comprises:
   one or more quantum well layer structure, said one or more quantum well layer structure in said active layer absorbing said pump light.

9. The laser structure of claim 1 wherein said active layer in said optically pumped laser further comprises:
   one or more absorbing layers, said one or more absorbing layers absorbing said pump light, and one or more quantum well layer structure, said one or more quantum well layer structure in said active layer generating light.

10. The laser structure of claim 1 further comprising:
    a grating pattern.

11. The laser structure of claim 1 further comprising a nested, dual ridge structure.

12. The laser structure of claim 1 wherein said optical pump laser further comprises:
    a first doped p-type cladding layer;
    a first electrical contact disposed on said first cladding layer;
    a second doped n-type cladding layer, wherein said active layer is disposed between said first and said second cladding layers;
    and a second electrical contact disposed on said second cladding layer.

13. A method for building an integrated optical pump laser and external-cavity laser, said method comprising:
    forming an optically pumped gain element portion comprising an active layer;
    forming an optical cavity of said external-cavity laser that includes said active layer, said optical cavity having a primary longitudinal axis; and
    forming a pump laser portion, wherein an optical mode associated with said pump laser at least partially overlaps said active layer, wherein light generated by said pump laser propagates substantially parallel to said primary longitudinal axis.

14. The method of claim 13 further comprising:
    providing a coating capable of reflecting said light generated by said pump laser and capable of transmitting light generated by said active layer.

15. The method of claim 13 wherein forming said optically pumped gain element portion comprises forming said active layer capable of absorbing pump light and capable of generating light, and wherein forming said pump laser portion further comprises forming an active layer capable of generating pump light and forming a plurality of cladding layers adjacent to said active layer.

16. The method of claim 13 further comprising:
    bonding together said pump laser portion and said optically pumped gain element portion.

17. The method of claim 13 further comprising:
    forming a heat sink; and
    electrically and thermally bonding said pump laser portion to said heat sink.

18. A wavelength tunable external-cavity laser structure comprising:
    an integrated structure comprising an optically pumped gain element containing an active layer;
    an optical pump laser, wherein an optical mode of said optical pump laser at least partially overlaps said active layer, wherein light generated by said optical pump laser propagates substantially parallel to light generated by said active layer;
    an external grating; and
    a partially reflecting mirror surface.

19. The tunable laser structure of claim 18 further comprising:
    a movable tuning element.

20. The tunable laser structure of claim 18 further comprising:
    coating disposed on said integrated structure, wherein said coating reflects said light generated by said optical pump laser, wherein said coating transmits light generated by said optically pumped gain element.

* * * * *